United States Patent [19]

Yale et al.

[11] Patent Number: 5,017,521
[45] Date of Patent: May 21, 1991

[54] BOROSILICATE GLASS COMPOSITIONS INCORPORATING CERIUM OXIDE

[75] Inventors: Brian Yale, Ormskirk; Kenneth M. Fyles, Wigan, both of England

[73] Assignee: Pilkington plc, Merseyside, England

[21] Appl. No.: 93,601

[22] Filed: Sep. 8, 1987

[30] Foreign Application Priority Data

Sep. 26, 1986 [GB] United Kingdom ................ 8623214

[51] Int. Cl.$^5$ .................. C03C 4/08; C03C 3/095
[52] U.S. Cl. ........................ 501/64; 501/65; 501/66; 501/67; 501/905
[58] Field of Search ............ 501/905, 65, 65, 66, 501/67

[56] References Cited

U.S. PATENT DOCUMENTS

| | | | |
|---|---|---|---|
| 2,657,146 | 10/1957 | Kreidl | 501/64 |
| 3,022,181 | 2/1961 | Connelly | 501/905 |
| 3,146,120 | 8/1964 | Upton et al. | 501/905 |
| 3,404,015 | 10/1968 | Dumbaugh | 501/66 |
| 3,499,776 | 3/1970 | Baak et al. | 501/65 |
| 3,519,446 | 7/1970 | Earl | 501/66 |
| 4,540,672 | 9/1985 | Boudot et al. | 501/64 |
| 4,565,791 | 1/1986 | Boudot et al. | 501/67 |

FOREIGN PATENT DOCUMENTS 56-32347  1/1981  Japan ..................... 501/95

Primary Examiner—Theodore Morris
Assistant Examiner—David M. Brunsman
Attorney, Agent, or Firm—Burns, Doane, Swecker & Mathis

[57] ABSTRACT

A low alkali borosilicate glass composition comprising
60 to 78% by weight of $SiO_2$
10 to 25% by weight of $B_2O_3$
3.5 to 6.0% by weight of $R_2O$, wherein $R_2O$ represents $Na_2O$, $K_2O$ and/or $Li_2O$,
2.0 to 6.5% by weight of $CeO_2$, and
0.25 to 8.0% by weight of $Sb_2O_3$ and/or $As_2O_3$, the percentages being based on the total weight of the glass composition. The glass composition of the invention are suitable for use as protective covers for solar cells, especially solar cells which are used in satellites.

14 Claims, No Drawings

BOROSILICATE GLASS COMPOSITIONS INCORPORATING CERIUM OXIDE

FIELD OF THE INVENTION

The present invention relates to borosilicate glass compositions. More particularly, the invention relates to borosilicate glass compositions which incorporate cerium oxide and which are suitable for use as protective covers for solar cells, especially solar cells used in satellites.

BACKGROUND OF THE INVENTION

Glass compositions which are intended for use as protective covers for solar cells must have a number of optical characteristics. Such glass compositions must, inter alia, exhibit the following properties:

(i) good white light transmission with at least 80% of incident light being transmitted at 400 nm and 85% of incident light being transmitted at 450 nm (for a sample having a thickness in the range of 50 to 300 microns);

(ii) low ultra-violet light transmission i.e. high UV absorption at wavelengths below 320 nm, with less than 5% incident radiation being transmitted, more preferably less than 2% incident radiation being transmitted (for a sample having a thickness in the range of 50 to 300 microns);

(iii) absence of significant discolouration (also known as radiation stability) when exposed to solar radiation of space which comprises inter alia, ultra-violet light, low energy electrons, protons and X-rays.

Furthermore, such glass compositions must have a coefficient of linear expansion which is the same as, or close to, that of silicon. Borosilicate glasses are found to have coefficients of linear expansion which are of the desired value.

It is known that incorporation of cerium oxide in borosilicate glass compositions leads to a glass having the high ultra-violet absorption which is required of a glass composition which is to be used as a protective cover for a solar cell.

However, it is difficult to incorporate cerium oxide into the glass in relatively large quantities (i.e. above 2% by weight) owing to the fact that cerium oxide tends to induce phase separation in the glass and also tends to impart a yellow to brown colouration in the glass thereby impairing the high white light transmission of the glass.

SUMMARY OF THE INVENTION

The present invention aims to overcome these drawbacks by providing a class of borosilicate glass compositions which contain 2.0% by weight or more of $CeO_2$, in the presence of antimony oxide and/or arsenic oxide.

Accordingly, the present invention provides a low alkali borosilicate glass composition comprising
60 to 78 % by weight of $SiO_2$
10 to 25 % by weight of $B_2O_3$
3.5 to 6.0 % by weight of $R_2O$, wherein $R_2O$ represents $Na_2O$, $K_2O$ and/or $Li_2O$,
2.0 to 6.5 % by weight of $CeO_2$, and
0.25 to 8.0 % by weight of $Sb_2O_3$ and/or $As_2O_3$,
the percentages being based on the total weight of the glass composition.

DETAILED DESCRIPTION OF THE INVENTION

Cerium oxide (ceria) is necessary to impart the required UV absorption and radiation stability to the borosilicate glass compositions. Ceria is always expressed as ceric or cerium 4 oxide, even though it is generally present in the glass as a mixture of ceric and cerous (cerium 3) oxides, and may even be present wholly as cerium 3 oxide.

It is difficult to incorporate large quantities of cerium ox low-alkali borosilicate glass compositions owing to the tendency of cerium to promote phase separation, and the maximum cerium levels can only be used with boric oxide levels below about fifteen percent. Cerium oxides also tend to impart a yellow to brown colouration to known borosilicate glass compositions, and it is difficult to combine the maximum UV absorption with good white light transmission. For example, if ceric oxide is added to a typical commercial low-expansion borosilicate glass of the type known as Pyrex, then the glass becomes darkly coloured with cerium oxide contents exceeding about two percent and the glasses will be unsuitable for use as solar cell covers.

We have found that in borosilicate glass compositions which incorporate cerium oxide, the quantity of cerium oxide can be increased above 2% by weight if the glass composition incorporates $Sb_2O_3$ and/or $As_2O_3$ in a total amount of from 0.25 to 8.0% by weight.

Preferably, the amount of $Sb_2O_3$ is from 0 to 2.5% by weight, and the amount of $As_2O_3$ is from 0 to 2.5% by weight. Antimony and/or arsenic oxides have been found to have a marked effect on the colour of borosilicate glass compositions containing cerium. The antimony and arsenic oxides increase the transmission of the borosilicate glass in the visible part of the spectrum and allow the desired combination of good white light transmission, low ultra-violet light transmission and high radiation stability to be obtained.

Titanium dioxide in combination with cerium oxide serves to reduce the UV transmission of the glasses and to reduce the tendency of the glasses to darken when exposed to radiation (i.e. it increases the radiation stability of the glass). Incorporation of titanium dioxide in the glass compositions thus makes it possible to use lower cerium levels than would otherwise be necessary. Furthermore, titanium dioxide also reduces melt viscosity more than does cerium oxide, and the presence of titanium dioxide improves melting and refining. However, titanium dioxide also increases visible absorption and this restricts the amount which may be included in the borosilicate glass compositions of the invention.

Preferably, the glass compositions comprise up to 2.0% by weight $TiO_2$. Typically, the amount of $TiO_2$ ranges from 0.25 to 2.0% by weight, and the total amount of $TiO_2 + CeO_2$ in the glass composition ranges from 3.5 to 7.0% by weight.

Alumina ($Al_2O_3$) helps to improve the chemical durability of the glass composition and helps to inhibit phase separation, but it increases liquidus temperatures, and also darkens the colour of the glasses. Zirconia ($ZrO_2$) also improves chemical durability, and does not darken the colour as much as alumina, but increases liquidus temperature more than does alumina.

Preferably, the glass compositions of the invention comprise up to 3% by weight of $Al_2O_3 + ZrO_2$. Typically, the amount of $Al_2O_3$ ranges from 0.5 to 3% by weight and the amount of $ZrO_2$ ranges from 0 to 2% by weight.

Boric oxide ($B_2O_3$) contents below 10% by weight lead to melting and refining difficulties. Melting and refining of the glass composition improve as boric oxide levels increase, but phase separation can occur if maximum cerium levels coincide with maximum boron levels.

We have found that the total amount of the oxides of lithium, sodium and potassium (defined as $R_2O$ above) must be limited to about 6.0% by weight to keep the coefficient of linear thermal expansion of the borosilicate glass close to that of silicon. The optimum amount has been found to be approximately 4.5%. The minimum amount of $R_2O$ is at approximately 3.5% total but melting of the glass components becomes more difficult as alkali levels fall and there is no advantage in seeking to minimise alkali contents.

The individual alkali metal oxides have different properties. Lithium oxide is the most effective in promoting melting and refining, and also gives good white light transmission, but the tendency to phase separate is aggravated and lithium oxide must not exceed about 1.5% by weight of the glass. Potassium oxide is the least effective in promoting melting and refining and gives darker glasses, but phase separation is minimised. Sodium oxide occupies an intermediate position. A mixture of all three alkali metal oxides offers advantages. If lithium oxide is present above 1% then the maximum sodium oxide level is approximately 3% in order to avoid phase separation.

Preferred contents of the alkali metal oxides are as follows:

$Li_2O$ 0 to 1.5 % by weight
$Na_2O$ 0 to 5.5 % by weight
$K_2O$ 0 to 5.5 % by weight In addition, zinc oxide and/or alkaline earth metal oxides such as MgO, BaO, CaO and SrO may be added to the batch of glass forming components. These materials are of value in reducing the viscosity of the glass melt when such reduction is required. Typically, the amount of ZnO added to the batch can be up to 5% by weight; the amount of alkaline earth metal oxides can be up to 5% by weight.

The borosilicate glass compositions of the invention are prepared using conventional procedures for the preparation of borosilicate glasses. Accordingly specific details of the preparation of the glass compositions are not given herein since a person skilled in the art will readily be able to determine the appropriate processing conditions for preparing the borosilicate glass compositions.

We have found that the low alkali borosilicate glass compositions of the invention provide the desired optical characteristics of good white light transmission, high ultra-violet light absorption and good radiation stability which are required for a glass composition which is to be used as a protective cover for a solar cell.

A further advantage of the glass compositions of the invention is that the glass compositions are suitable for the manufacture of thin micro-sheet having a thickness of about 50 to 300 microns which is desirable for glass which is to be used as a protective cover for solar cells. The present glass compositions also have a coefficient of linear expansion close to that of silicon and possess the added characteristic that they can readily be sealed to a silicon surface.

Moreover, the present borosilicate glass compositions readily lend themselves to pretreatments such as cleaning, etching and coating. In contrast, many known borosilicate glass compositions are not suitable for such pretreatments since they have poor chemical durability and a tendency to undergo phase separation if subjected to the said pretreatments.

Specific embodiments of the invention will now be described in more detail, by way of example only, and with reference to the following Table which sets out examples of glass compositions in accordance with the invention, showing their compositions on an oxide basis.

The Examples in the accompanying Table broadly illustrate the glass compositions of the invention. Examples numbers 1, 2, 3, 4, 8, 14, 16, 18 and 26 have been tested for radiation stability by exposing polished samples, thickness between 100 microns and 200 microns, to $5.7 \times 10^{15}$ 1 MEV electrons in vacuum ($<1 \times 10^{-3}$ torr) and measuring the loss in visible light transmission. Transmission losses ranged from 1.5% to 4.0% between 400 and 450 nm, which is regarded as satisfactory.

Samples of Examples 1, 2, 3, 4 and 18 have been electrostatically bonded to silicon and the composites have withstood one thousand cycles between $-170°$ C. and $+100°$ C. without delamination.

The thickness of covers for solar cells can range from 50 microns to 300 microns; it is possible f-or many formulations of glass compositions within the scope of the present invention to be suitable for producing thin glass sheets but unsuitable for producing thick glass sheets, and vice versa. Thus, for producing covers thinner than about 100 microns the total amount of $CeO_2$ plus $TiO_2$ needs to be high, typically greater than five percent, to give the required UV absorption. However, many of these compositions will be coloured too darkly to be suitable for the thicker covers. These high UV absorbing glasses may be bleached to some extent by increasing antimony concentrations to above one percent, but maximum levels of $CeO_2+TiO_2$ (ceria plus titania) are not necessary for the thicker covers (i.e. above about 150 microns in thickness) and it would therefore also be possible to use $CeO_2+TiO_2$ levels below five percent in these cases.

TABLE I

| Example No. | OXIDE COMPOSITION (WEIGHT %) | | | | | | | | | |
|---|---|---|---|---|---|---|---|---|---|---|
| | $SiO_2$ | $Li_2O$ | $Na_2O$ | $K_2O$ | $B_2O_3$ | $Al_2O_3$ | $TiO_2$ | $CeO_2$ | $Sb_2O_3$ | Other oxide |
| 1 | 71.5 | 1 | 1 | 2.5 | 18.5 | 1 | 1 | 3 | 0.5 | |
| 2 | 71.5 | 1 | 1 | 2.5 | 19.5 | 1 | 1 | 2 | 0.5 | |
| 3 | 71.5 | 1 | 1 | 2.5 | 18.5 | 1 | 2 | 2 | 0.5 | |
| 4 | 71.5 | 1 | 1 | 2.5 | 19.25 | 1 | 1 | 2 | 0.5 | $As_2O_3$ 0.25 |
| 5 | 71.5 | 1 | 1 | 2.5 | 17.5 | 2 | 1 | 3 | 0.5 | |
| 6 | 71.5 | 1 | 1 | 2.5 | 19 | 0.5 | 1 | 3 | 0.5 | |
| 7 | 71.5 | 1 | 1 | 2.5 | 17.5 | 1 | 1 | 3 | 0.5 | $ZrO_2$ 1 |
| 8 | 72 | 1 | 1 | 2.5 | 19 | 0.5 | 0.5 | 3 | 0.5 | |
| 9 | 72 | 1 | 1 | 2.5 | 18.5 | 0.5 | 0.5 | 3 | 1.0 | |
| 10 | 72 | 1 | 1 | 2.5 | 19.25 | 0.5 | 0.5 | 3 | 0.25 | |

TABLE I-continued

| Example No. | SiO$_2$ | Li$_2$O | Na$_2$O | K$_2$O | B$_2$O$_3$ | Al$_2$O$_3$ | TiO$_2$ | CeO$_2$ | Sb$_2$O$_3$ | Other oxide |
|---|---|---|---|---|---|---|---|---|---|---|
| 11 | 75 | 1 | 1 | 3.5 | 15.1 | 0.5 | .5 | 3 | 0.4 | |
| 12 | 72 | 1 | 1 | 2.5 | 16.5 | 0.5 | 0.5 | 5 | 1.0 | |
| 13 | 74.8 | 1 | 2.37 | 1.63 | 13 | 1 | 0.5 | 5 | 0.7 | |
| 14 | 76.25 | 1 | 1 | 2.5 | 13 | 0.5 | 0.25 | 5 | 0.5 | |
| 15 | 75.75 | 1 | 1 | 3 | 13 | 0.5 | 0.25 | 5 | 0.5 | |
| 16 | 72 | 1 | 1 | 2.5 | 18.2 | 0.5 | 0.3 | 4 | 0.5 | |
| 17 | 76.25 | 1 | 2.5 | 1 | 13 | 0.5 | 0.25 | 5 | 0.5 | |
| 18 | 75.75 | 1 | 3 | 1 | 13 | 0.5 | 0.25 | 5 | 0.5 | |
| 19 | 75 | 1 | 1 | 4 | 13.1 | 2 | 0.5 | 3 | 0.4 | |
| 20 | 73 | 1 | 3 | 1 | 13.5 | 2 | — | 6 | 0.5 | |
| 21 | 73.75 | 1 | 2 | 2 | 13.5 | 1 | 0.25 | 5 | 0.5 | ZrO$_2$ 1 |
| 22 | 74 | 1 | 1.75 | 2 | 13.5 | 2 | 0.25 | 5 | 0.5 | |
| 23 | 74.75 | 1 | 1.5 | 2 | 13.5 | 0.5 | 0.25 | 5 | 0.5 | ZrO$_2$ 1 |
| 24 | 73.75 | 1 | 1.5 | 2 | 13.5 | 0.5 | 0.25 | 6 | 0.5 | 1 |
| 25 | 75.25 | 1 | 1.5 | 2 | 13.5 | — | 0.25 | 6 | 0.5 | |
| 26 | 75.25 | 1 | 1 | 2.5 | 12.5 | 0.5 | 0.25 | 5 | 2 | |
| 27 | 76.75 | 0.5 | 2 | 2 | 12.5 | 0.5 | 0.25 | 5 | 0.5 | |
| 28 | 75.75 | 1 | 1 | 2.5 | 12.5 | 0.5 | 0.25 | 5 | 0.5 | ZnO 1 |
| 29 | 74 | 0 | 4.5 | 0 | 12.5 | 2 | — | 5 | 2.0 | |
| 30 | 75.25 | 1 | 0 | 3.5 | 12.5 | 0.5 | 0.25 | 5 | 2 | |
| 31 | 75.25 | 0.5 | 1 | 3 | 12.5 | 0.5 | 0.25 | 5 | 2 | |
| 32 | 73.75 | 1 | 1 | 2.5 | 12 | 0.5 | 0.25 | 5 | 4 | |
| 33 | 60 | 0 | 0 | 5.5 | 25 | 1 | 1.5 | 2 | 4 | ZrO$_2$ 1 |
| 34 | 75.25 | 0.75 | 1 | 3 | 12.25 | 0.5 | 0.25 | 5 | 2 | |
| 35 | 75.25 | 0.5 | 1.25 | 3 | 12.25 | 0.5 | 0.25 | 5 | 2 | |
| 36 | 72.25 | 1 | 1 | 2.5 | 11.5 | 0.5 | 0.25 | 5 | 6 | |
| 37 | 70.75 | 1 | 1 | 2.5 | 11 | 0.5 | 0.25 | 5 | 8 | |
| 38 | 75 | 0.5 | 1 | 3.5 | 12.25 | 0.5 | 0 | 5.25 | 2 | |
| 39 | 73.25 | 0.75 | 1.75 | 2 | 13.5 | 1 | 0.25 | 6 | 0.5 | ZrO$_2$ 1 |
| 40 | 74.25 | 1.5 | 0 | 3 | 12.0 | 2 | 0.25 | 5 | 2 | — |
| 41 | 75.25 | 1 | 1 | 2.5 | 12.5 | 0.5 | 0.25 | 5 | 0 | As$_2$O$_3$ 2 |
| 42 | 70.45 | 0.75 | 0.75 | 4 | 19.5 | 0.75 | 0.3 | 3 | 0.5 | |
| 43 | 73.25 | 1 | 1 | 2.5 | 12.5 | 0.5 | 0.25 | 5 | 2 | ZnO 2 |
| 44 | 73.25 | 1 | 1 | 2.5 | 10.5 | 0.5 | 0.25 | 5 | 2 | ZnO 4 |
| 45 | 73.25 | 1 | 1 | 2.5 | 12.5 | 0.5 | 0.25 | 5 | 2 | BaO 2 |
| 46 | 73.25 | 1 | 1 | 2.5 | 12.5 | 0.5 | 0.25 | 5 | 2 | CaO 2 |
| 47 | 73.25 | 1 | 1 | 2.5 | 12.5 | 0.5 | 0.25 | 5 | 2 | MgO 2 |
| 48 | 73.25 | 1 | 1 | 2.5 | 12.5 | 0.5 | 0.25 | 5 | 2 | SrO 2 |
| 49 | 74 | 0 | 2.25 | 3 | 13 | 0.5 | 0.25 | 5 | 2 | |
| 50 | 67.45 | 0.75 | 0.75 | 3.75 | 23 | 0.5 | 0.1 | 3.2 | 0.5 | |

We claim:

1. A low alkali borosilicate glass composition comprising
   60 to 78% by weight of SiO$_2$
   10 to 25% by weight of B$_2$O$_3$
   3.5 to 6.0% by weight of R$_2$O, wherein R$_2$O represents Na$_2$O, K$_2$O and/or Li$_2$O,
   2.0 to 6.5 % by weight of CeO$_2$, and
   0.25 to 8.0 % by weight of Sb$_2$O$_3$ and/or As$_2$O$_3$,
the percentages being based on the total weight of the glass composition.

2. A borosilicate glass composition according to claim 1, wherein the amount of Sb$_2$O$_3$ is from 0 to 2.5% by weight.

3. A borosilicate glass composition according to claim 1, wherein the amount of As$_2$O$_3$ is from 0 to 2.5% by weight.

4. A borosilicate glass composition according to claim 1, further comprising up to 3% by weight of Al$_2$O$_3$ and/or ZrO$_2$.

5. A borosilicate glass composition according to claim 4, wherein the amount of Al$_2$O$_3$ is from 0.5 to 3% by weight, and the amount of ZrO$_2$ is from 0 to 2% by weight.

6. A borosilicate glass composition according to claim 1, further comprising up to 2.0% by weight of TiO$_2$.

7. A borosilicate glass composition according to claim 6, wherein the amount of TiO$_2$ is from 0.25 to 2.0%, and the total amount of TiO$_2$ + CeO$_2$ is from 3.5 to 7.0% by weight.

8. A borosilicate glass composition according to claim 1, wherein the amount of R$_2$O is 4.5% by weight.

9. A borosilicate glass composition according to claim 1, wherein the amount of LiO$_2$ is from 0 to 1.5% by weight.

10. A borosilicate glass composition according to claim 1, wherein the amount of Na$_2$O is from 0 to 5.5% by weight.

11. A borosilicate glass composition according to claim 1, wherein the amount of K$_2$O is from 0 to 5.5% by weight.

12. A borosilicate glass composition according to claim 1, further comprising up to 5.0% by weight of ZnO.

13. A borosilicate glass composition according to claim 1, further comprising up to 2.5% by weight of MgO, CaO, BaO or SrO.

14. A protective cover for a solar cell made from a borosilicate glass composition comprising:
   60 to 78% by weight of SiO$_2$
   10 to 25% by weight of B$_2$O$_3$
   3.5 to 6.0% by weight of R$_2$O, wherein R$_2$O represents Na$_2$O, K$_2$O and/or Li$_2$O,
   2.0 to 6.5% by weight of CeO$_2$, and
   0.25 to 8.0% by weight of Sb$_2$O$_3$ and/or As$_2$O$_3$,
the percentages being based on the total weight of the glass composition.

* * * * *